United States Patent [19]

Chiang

[11] 3,837,945

[45] Sept. 24, 1974

[54] PROCESS OF ETCHING COPPER CIRCUITS WITH ALKALINE PERSULFATE AND COMPOSITIONS THEREFOR

[75] Inventor: John Shu-chi Chiang, Mercerville, N.J.

[73] Assignee: FMC Corporation, New York, N.Y.

[22] Filed: Mar. 22, 1972

[21] Appl. No.: 236,936

[52] U.S. Cl. .......................... 156/8, 156/18, 156/19, 252/79.4

[51] Int. Cl. .......................... C23f 1/02

[58] Field of Search .......................... 252/79.2, 79.4, 79.5; 156/18, 19, 3, 8

[56] References Cited

UNITED STATES PATENTS

| | | | |
|---|---|---|---|
| 3,650,958 | 3/1972 | Shipley | 156/18 X |
| 3,677,950 | 7/1972 | Alderuccio | 252/79.5 |

*Primary Examiner*—William A. Powell

[57] ABSTRACT

Copper circuits are etched with an ammoniacal aqueous solution of from about 0.4 mole/liter to limit of solubility of cupric amine sulfate maintained at a pH of 8–12 with ammonia, buffered with an ammonium salt and activated by a soluble peroxydisulfate whose concentration does not exceed about 0.4 moles/liter. Preferably, the cupric amine solution is used in a continuous process wherein automatic feed valves maintain ammonia concentration to provide a pH between 9.0 to 10.0 and peroxydisulfate concentration not in excess of 0.1 moles/liter. The feed valves are controlled by voltage sensitive relays. The output from a pH meter activates the relay for controlling ammonia feed while the EMF developed between a platinum and reference electrode immersed in the etchant, activates the relay for controlling peroxydisulfate feed.

The etchant composition exhibits low undercutting thereby rendering it especially suitable for fine line circuits and circuits resisted with noble metals such as gold/nickel.

9 Claims, 1 Drawing Figure

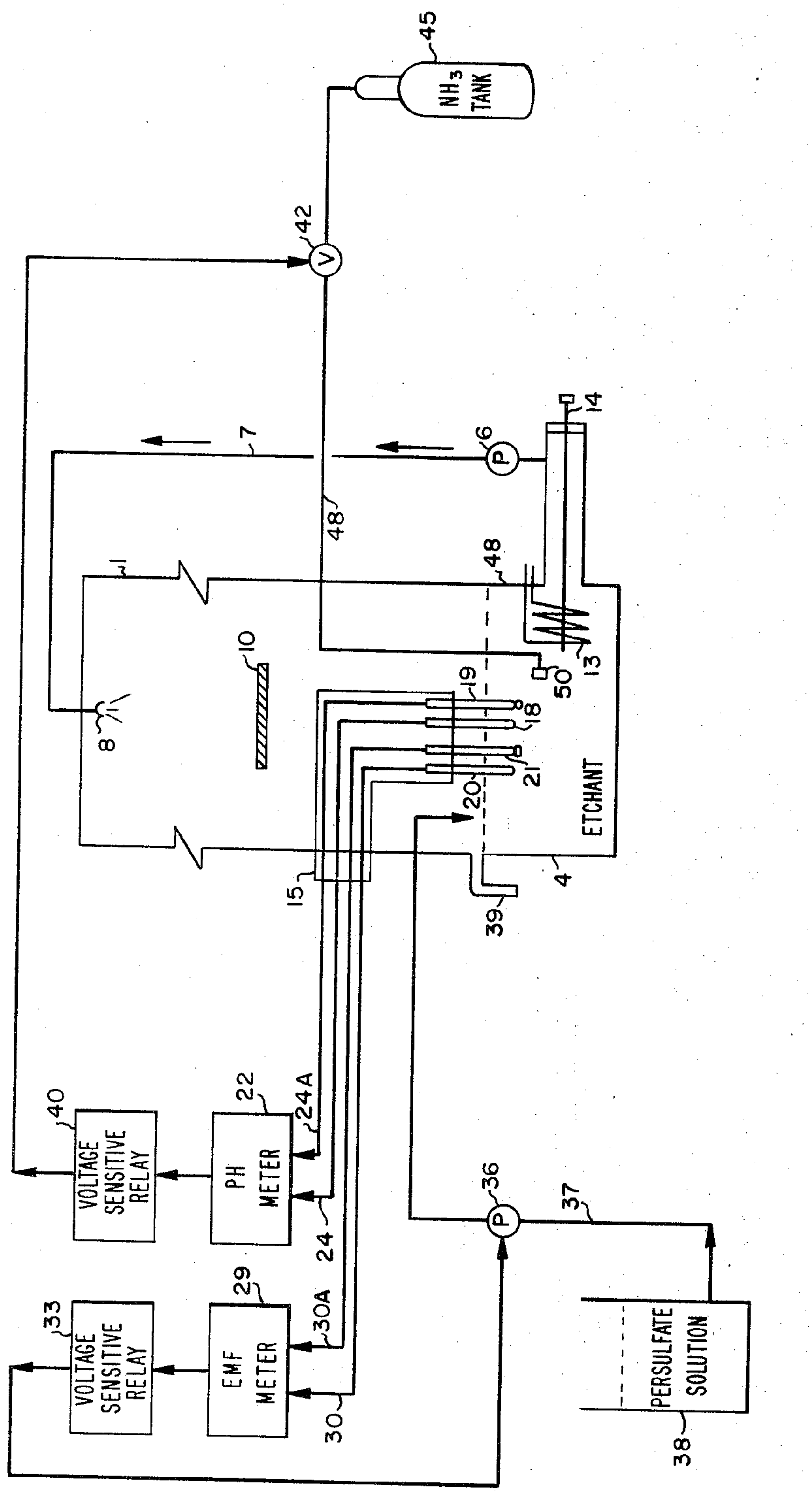
NH3 TANK
ETCHANT
VOLTAGE SENSITIVE RELAY
PH METER
EMF METER
VOLTAGE SENSITIVE RELAY
PERSULFATE SOLUTION
V
P
P
45
42
7
6
14
48
48
1
10
13
50
19
18
8
21
20
15
4
39
40
22
24A
24
29
30A
30
33
36
37
38

PROCESS OF ETCHING COPPER CIRCUITS WITH ALKALINE PERSULFATE AND COMPOSITIONS THEREFOR

This invention relates to copper etching and in particular to the production of copper circuits.

Methods have been developed for selectively dissolving of etching copper in the manufacture of electrical printed circuits, printing plates or other products having predetermined raised portions or reliefs of copper metal. In one commonly practiced method, copper foil is laminated to an insulating board or base sheet such as plastic or fiber/resin. The foil is next coated with a photosensitive layer and exposed through a negative mask of the circuit thereby forming a photoresist in the exposed areas. After removal of the soluble coating in the non-light struck area, the positive copper circuit image is then plated with a solderable protective metal(s), the photoresist removed and the copper background areas dissolved out by etching leaving the metal plated copper circuit bonded to the insulating base. Since it protects the copper from dissolution during the etching operation, the metal coating or plating is referred to as a resist but is not to be confused with the photoresist used in forming the copper image.

Etchants suitable for the production of copper circuits include acid and alkaline types. Among the former, cupric chloride, ferric chloride, chromic/sulfuric acid and acid peroxydisulfate are most frequently used. Of the alkaline type etchants, ammoniacal sodium chlorite is generally conceded to be the only practical member. Other potential alkaline copper etchants are ammoniacal peroxydisulfate formulations. Examples of such formulations are (1) solutions containing $(NH_4)S_2O_8$, and $CuCO_3$ and $NH_4OH$ for etching copper and its alloys to bring out a clear microstructure without oxidation: CA52, 15410f, (2) aqueous solutions containing $(NH_4)_2S_2O_8$, KCN andn $NH_4OH$ or $NH_4NO_3$ for removing Ni or Co from iron substrates: CA55, 15314g., (3) $(NH_4)_2S_2O_8$ in $NH_4OH$ for cleaning copper deposits from tools: CA59, 14945f, and (4) use of $(NH_4)_2S_2O_8$ in feedwater heaters: CA64, 1815h.

All the above formulations involve high starting concentrations of peroxydisulfate and tend to be extremely unstable once any copper metal is dissolved. Such formulations when applied to etching of printed circuits give rise to erratic etch rates. In fact the peroxydisulfate decomposition can be extremely vigorous and evolve enough heat to damage plastic etching equipment. Manifestly, these alkaline peroxydisulfate formulations are not satisfactory for etching of copper printed circuits.

The normal procedure in formulating and using an etching solution is to prepare a concentrated solution of an oxidant for copper and to etch copper with such a solution until spent. During the process of etching copper, the etch rate decreases as the concentration of oxidant decreases and the amount of copper in the etchant increases. Examples of such practice is the etching of printed circuits with acid ammonium peroxydisulfate is set forth in U.S. Pat. No. 2,978,301.

Such batch etching practice has the disadvantage of constantly changing concentrations of oxidant and copper such that etch rates and etch factors are not constant during the course of dissolving copper.

While satisfactory for producing copper circuits resisted with an organic coating or solder or tin, presently available etchants cause excessive undercutting when used to etch fine line circuits or those circuits resisted with a noble metal such as gold or a combination of gold/nickel. In the etching art the term undercutting refers to removal of material from the side of the circuit relief pattern and, in severe cases, results in a weakened structure which tends to crumble or break up with concomitant unreliable electrical performance. The effect is particularly bothersome when using acid etchants. Although undercutting is not so pronounced with alkaline sodium chlorite etchant, the problem here is that sodium chlorite is such a highly combustible and reactive chemical that its use poses severe problems in any large scale operation. Certainly, alkaline chlorite etchants would not be favored for the large scale manufacture of copper circuits.

In view of the strong trend in recent years toward miniaturization of electronic components calling for increased use of fine line circuits and noble metal resisted circuits, it is quite apparent that there is a pressing need for an improved copper etchant having low undercutting properties and that is safe, economical and convenient to use.

It has now been discovered that improved etching of copper circuits, particularly those resisted with noble metals, can be realized by using as the etchant an ammoniacal aqueous solution of form about 0.4 mole/liter to limit of solubility of cupric amine sulfate at a pH of 8–12, buffered with an ammonium salt and activated with sufficient soluble peroxydisulfate whereby the etchant is maintained in an oxidizing condition and the provisions of such novel etchant compositions and their use in the production of copper circuits constitutes the overall object of the invention. It is a more specific object of the invention to provide a novel etchant for noble metal resisted copper circuits comprising an aqueous ammoniacal solution of from about 0.4 mole/liter to limit of solubility of copper amine sulfate and sufficient ammonia to maintain a pH of 8–12; an ammonium salt as a buffer for the ammonia and activated with up to about 0.4 mole/liter of a soluble peroxydisulfate whereby the etchant is maintained in an oxidizing condition. It is a further object of the invention to provide a continuous process for etching copper circuits using as the etchant an aqueous ammoniacal solution of aqueous persulfate about 0.4 mole/liter to limit of solubility of copper amine sulfate, an ammonium salt as a buffer for the ammonia and maintained in an oxidizing condition with a soluble peroxydisulfate and wherein the pH of the etchant is held between 9.0 to 10.0 by an ammonia feed line and the concentration of peroxydisulfate is maintained at no higher than about 0.1 moles/liter by an aqueous feed line. Other objects and purposes of the invention will become manifest subsequently.

The single FIGURE drawing is a flow diagram of a continuous etch process using the copper etchants of the invention.

In formulating the etchant compositions of the invention, an ammoniacal cupric amine sulfate solution is first prepared by dissolving in water cupric sulfate and an ammonium salt, preferably ammonium sulfate and sufficient ammonia to give a pH in the range of 8.0–12.0 preferably 9.0 to 10.0. The double salt $CuSO_4 \cdot (NH_4)_2SO_4 \cdot 6H_2O$, a by-product of the acid persulfate etching process, can be substituted for copper sulfate and ammonium sulfate. To the aforesaid solution, preferably containing a concentration of cupric amine sulfate from about 0.4 mole/liter to the limit of solubility, is then added a soluble peroxydisulfate, preferably ammonium peroxydisulfate although other soluble peroxydisulfates are satisfactory particularly the peroxydisulfates of the alkali metals e.g., sodium, potassium and lithium.

The quantity of peroxydisulfate is not critical since essentially identical etch rates are obtained over a wide range of concentrations. For instance, 0.001 to 0.005 mole/liter of ammonium peroxydisulfate gave etch rates of about 1.1 to 1.2 mil/minutes. Even when the peroxydisulfate concentration was raised to 0.4 mole/-liter (a 400 fold increase) the etch rate increased to only about 2.0 mil/minute. Apparently, the peroxydisulfate functions as an activator rather than a primary etching agent as in the case of acid peroxydisulfate etchants. By way of explanation it is thought that the peroxydisulfate combines with cupric ion or cupric amine ion of the etchant thereby forming an activate complex which constitutes the active etching entity. The effect of the peroxydisulfate is to keep the ammoniacal cupric amine sulfate etchant in an oxidized condition.

In order to provide a means for controlling the etching bath, it was discovered quite unexpectedly, that the EMF developed between a platinum electrode and a reference electrode, such as a calomel electrode or a silver-silver chloride electrode, immersed in the etchant solution is a function of the persulfate concentration and therefore may be used for persulfate concentration control. Thus far the mechanism of this response of the platinum electrode to the peroxydisulfate concentration has not been ascertained.

Peroxydisulfate concentrations of 0.001 to 0.1 mole/-liter in the etchant solution result in EMF readings from 200 to 500 millivolts developed between a platinum electrode and a reference silver-silver chloride electrode immersed in the etchant solution. It was noted that the addition of peroxydisulfate to the etchant solution did not produce a steady EMF reading within a short time interval, i.e., 1 to 2 minutes, indicating that some form of activation or reaction involving peroxydisulfate does occur in the etchant solution. However, the addition of metallic copper to the resulting etchant solution caused the EMF reading to rapidly decrease. The aforesaid is considered evidence tending to support the indirect role of the peroxydisulfate in forming the active etching agency in the ammoniacal cupric amine sulfate solution. As the upper end of the potential range is reached, the concentration of the peroxydisulfate approaches about 0.4 mole/liter at which point the EMF levels off at about 540 millivolts and does not increase with further increases in the peroxydisulfate concentration. The ammoniacal cupric amine etchants of the invention are desirably operated between an EMF potential of 200 to 540 millivolts between about 90°F and 130°F in order to keep the peroxydisulfate concentration at no more than about 0.4 mole/liter and thereby maintain the etchant in an oxidized state. Higher concentrations of peroxydisulfate can be used but are uneconomical and difficult to control.

As previously pointed out under the prior art discussion alkaline peroxydisulfate solutions, particularly at higher concentrations, tend to be unstable. When this occurs the resulting build-up of heat and decomposition products give use to erratic etch rates. The decomposition often proceeds with such rapidity as to become uncontrollable. However, it can be mitigated by the use of stabilizers of the type disclosed in Netherlands Publication 7,016,104. These stabilizing agents are mono and polyorganoamines, carboxy — substituted mono — and polyorganoamines and metal salts thereof, hydroxy — substituted mono — and polyorganoamines, mono — and polyorganoaminoethers, urea, and mono — and dialkyl substituted ureas, hydroxyl carboxylic acids, monohydroxy alcohols, dihydroxy alcohols, monoacylated dihydroxy alcohols, keto alcohols and aliphatic ketones and ethers. Preferred stabilizers of the class aforesaid for use with the process of the invention are methanol, acrylamine, sarcosine, nitrilotriacetic acid and iminodiacetic acid. The compounds are particularly effective in retarding peroxydisulfate decomposition when employed in cupric amine sulfate etchants containing up to about 0.4 mole of a soluble peroxydisulfate. However, it is preferred to work with peroxydisulfate concentrations no more than about 0.1 mole/-liter corresponding to the etchant EMF potential of 500 millivolts in the automatic process. Stability at 0.1 mole/liter of the peroxydisulfate is not a problem since if it were to decompose the amount of heat evolved and decomposition products are too insignificant to affect copper etch rate. However, any tendency toward decomposition can readily be controlled by addition of stabilizers.

The etchant of the invention is used in the known manner and can be sprayed directly onto the work or contained in baths or tanks where the work is immersed. Such techniques and procedures are spelled out in detail in any number of patents and publications concerned with the production of etched copper circuits.

In a generally preferred modus operandi, the etchants herein are used in a continuous process wherein the etchant is maintained in an oxidizing state by addition of sufficient peroxydisulfate whereby it does not exceed about 0.4 mole/liter the concentration at which the EMF of the etchant reaches maximum potential of about 540 millivolts. Ammonia is introduced to keep the pH between 9.0 to 10 and sufficient ammonium salt to buffer the ammonia. Since the cupric amine sulfate is a by-product of the reaction between the copper on the circuit board and ammoniacal peroxydisulfate, its concentration in the etchant increases as more copper is dissolved. However, the introduction of fresh peroxydisulfate solution displaces a like volume of spent etchant from the etcher so that once established the concentration of cupric amine sulfate remains substantially unchanged and can be maintained in the prescribed range of from about 0.4 mole/liter to limit of solubility. Ammonium salts are added to buffer the ammonia and maintain the desired pH range. Stabilizers are added where necessary.

In the most preferred embodiment of practicing the invention, the etchant is used in a continuous operation wherein electronic controls automatically maintain the peroxydisulfate concentration and pH at the optimum levels. In the automatic system, the EMF output from the electrodes in the etchant is connected to a voltage sensitive relay which in turn controls a pump or feed valve for introducing fresh peroxydisulfate into the etchant tank. When the EMF falls below the set point, the peroxydisulfate is below the desired concentration thereby signaling the relay to turn on the pump or open a valve and permit a fresh quantity to flow into the etchant tank. The flow will continue until the EMF exceeds the set point corresponding to the desired peroxydisulfate concentration. Preferably the EMF set point is adjusted to operate between 300 and 500 millivolts which maintains the peroxydisulfate between 0.003 to 0.1 mole/liter.

The pH of the etchant solution is preferably maintained at the desired range with automatic ammonia feed. A signal from a pair of electrodes, i.e., glass and reference electrodes in the etchant solution is fed to a pH-meter whose output triggers a voltage sensitive relay which controls a pump, a valve or other devices which feed ammonia gas or aqueous ammonia solution into the etchant.

The machinery for both EMF and pH control is well known in the art and available from suppliers of electronic and engineering components.

Fail-safe measures are preferably incorporated with the etching process. A temperature sensing device, set at a temperature about 5° to 10°F higher than the desired etching temperature is used to trigger a relay which turns off the persulfate feed, the ammonia feed, the heater or other inputs if the etchant should exceed the set temperature.

Stabilizers may be metered into the etchant solution at a predetermined rate to maintain the desired concentrations, may be added manually or may be mixed with the solid or liquid persulfate feed.

Reference is now made to the drawing which shows a flow diagram of the automatic etching process of the invention.

Describing the drawing in detail, 1 is an etcher having a sump 4 containing etchant solution. Pump 6 circulates the etchant via line 7 to nozzle 8 from whence the etchant sprays onto the copper work piece 10 and then returns to sump 4. Thermostatically controlled water cooling coil 13 and heater 14 maintain the etchant at the desired preset temperature. 15 is an electrode holder assembly having attached thereto electrodes 18, 19, 20 and 21 which are immersed in the etchant solution. 18 is a reference electrode and 19 a glass electrode. 20 is a reference electrode and 21 is a platinum electrode. Electrodes 20 and 21 are connected to EMF meter 29 via conductors 30 and 30a. As the etching proceeds, the quantity of dissolved copper in the etchant builds up resulting in decreased EMF between electrodes 20 and 21. When the EMF drops below a present value, the voltage sensitive relay 33 is tripped thereby turning on pump 36 which pumps fresh persulfate via line 37 from storage tank 38 into etcher 1. As the concentration of peroxydisulfate in the etcher increases, the EMF between electrodes 20 and 21 rises and when it reaches a preset output, relay 33 opens cutting off current to pump 36 thereby stopping the flow of peroxydisulfate. Overflow pipe 39 prevents the volume of etchant from increasing during addition of peroxydisulfate. The pH of the etchant is detected by electrodes 18 and 19 and the signal transmitted via conductors 24 and 24*a* to pH meter 22. When the pH drops below the desired preset limit, the resulting change in output from pH meter 22 closes relay 40 which opens valve 42 thereby admitting ammonia from tank 45 via line 48 into the etchant. A sparger 50 on the end of line 48 facilitates mixing of the ammonia with etchant. When the pH reaches the upper preset limit, the resulting change in output from pH meter 22 opens relay 40 which closes valve 42 thereby shutting off the flow of ammonia to etchant.

The process in the flow diagram is preferably operated in accordance with Example 6 where the EMF range is 300 to 410 millivolts corresponding to an ammonium peroxydisulfate concentration of from 0.003 to 0.02 mole/liter and the pH range is 9.5 to 9.7.

The pH and EMF meters equipped with amplifiers which step up signal output for operating relays are well known devices available from electronic and chemical supply firms.

Reference is now made to the following non-limiting examples.

EXAMPLE 1

This example shows that peroxydisulfate in an ammonia medium produces minimum undercutting for gold-nickel-resisted circuits but is too unstable to be practical.

An acid peroxydisulfate solution containing 0.8 m/l of ammonium peroxydisulfate, 0.25 m/l of dissolved copper, 0.2 m/l of ammonium phosphate and 5 ppm of mercuric ion was made alkaline with aqueous ammonia solution to a pH of about 9. About 1 g/l of phenol, a stabilizer for peroxydisulfate, was added to the solution just before the ammonia addition. The resulting solution was warmed to about 110°F and was allowed to immersion etch copper foil from a laminate printed circuit panel. The copper foil was partially covered with electrically plated gold-nickel metal which formed the circuit pattern and served as an etching resist; the copper thickness was about 1.4 mil (1.4 thousandth of an inch), known in the trade as "1-ounce copper." The exposed copper plate of the laminate panel was found to be completely etched away in 4.5 minutes. Subsequent evaluation showed that the etched circuit panel had a very high etch factor* of about 2.0 indicating the etchant solution produced minimum of undercutting during etching.

*Etch factor is the index commonly used to rate an etched circuit board for the degree of undercutting during etching and is defined as the ratio of vertical etch depth to side attack; the higher the etch factor the least the undercutting.

However, excessive gassing and temperature rise were observed for the solution indicating that peroxydisulfate in the solution has undergone rapid decomposition. The solution was cooled to 110°F and the etching test was repeated. It was noted that the exposed copper plate was not completely etched away in 30 minutes indicating that the solution had lost its etching capacity.

EXAMPLE 2

This example shows that stability of ammoniacal peroxydisulfate although improved with the use of a stabilizer, gives inconsistent etching characteristics when used with conventional batchwise etching.

A solution was prepared containing 0.76 m/l of ammonium peroxydisulfate, 0.12 m/l of dissolved copper, 0.28 m/l of ammonium chloride, about 3.8 m/l of total ammonia. The solution had a 9.8. About 1.0 vol. percent of methanol was added for peroxydisulfate stabilization.

The solution was warmed to 100°F and was allowed to spray etch 1-ounce copper circuit panels resisted with gold/nickel metal at a spray pressure of about 10 PSI. After the etching test, metallic copper was added to the solution to increase its copper content and another etching test was then performed. Etching tests and copper content modification continued until the solution reached about 1 m/l of dissolved copper. Aqueous ammonia (28 percent) was added to the solution periodically to maintain the pH at 9.8.

During the experiment, moderate gassing from the solution was noted and vigorous cooling was needed to maintain the etching temperature, indicating that peroxydisulfate in the solution had undergone mild decomposition.

Results of the etching tests are summarized in Table I.

Table I

| | | | | | | |
|---|---|---|---|---|---|---|
| Dissolved Copper, m/l | 0.12 | 0.24 | 0.36 | 0.60 | 0.84 | 1.08 |
| Etch Rates, mil/min. | 2.1 | 1.3 | 0.8 | 0.5 | 0.7 | 0.3 |
| Etch Factor for the gold/nickel circuit | 1.8 | 1.2 | 0.9 | 0.9 | 1.3 | 1.5 |

Very high etch rates were observed for the solution when it contained low dissolved copper. The etch rates dropped rapidly as the copper content of the solution increased. Erractic etch rates were noted when the solution contained 0.6 m/l or more of dissolved copper. The low and erratic etch rates may be due to the build-up of reaction products from the peroxydisulfate decomposition.

Etch factors produced for the gold-nickel resisted circuit panels varied with the copper content of the solution. Low etch factors or excessive undercutting were observed for the solution when it contained medium dissolved copper, while high etch factors were produced for the circuit panels when the solution contained either high or low dissolved copper. Such variable behavior in both etch rate and etch factors makes commercial utilization unfeasible.

EXAMPLE 3

This example establishes that a cupric amine sulfate solution activated with a small amount of ammonium peroxydisulfate produces uniform etching at high etch rates.

An aqueous solution was made up to contain 330 g/l of copper double salt ($CuSO_4{\cdot}(NH_4)_2SO_4{\cdot}6H_2O$); 380 ml/l of concentrated ammonia solution (28 percent); 25 g/l of ammonium chloride, and about 1 vol. percent of methanol. The pH of the solution was 9.6. The solution was warmed to 95°F and was allowed to spray etch 1-ounce copper laminate circuit panels, resisted with gold/nickel, at a spray pressure of 9 to 10 PSI. It was found that the solution was capable of etching copper, but the etch rate produced was very low, lower than 0.35 mil/min. However, an unexpectedly high etch rate of more than 0.7 mil/min was observed when the solution was modified to contain 20 g/l of ammonium persulfate (0.09 m/l). An even higher etch rate of 0.86 mil/min was noted when the solution was warmed to 100°F.

EXAMPLE 4

The procedure of Example 2 was repeated but using acrylamine in place of methanol. The results were essentially identical to those of the earlier example.

EXAMPLE 5

This example shows continuous etching technique using manual addition of peroxydisulfate. The solution was relatively stable, the etch rate and etch factors were relatively constant while peroxydisulfate utilization was very low.

A continuous etching trial was carried out using a solution identical to that shown in Example 3 except it contained no ammonium chloride. About 3 liters of such solution was transferred to the sump of a spray chamber. Metallic copper foil was fed into the chamber at a rate of about 28 g/hour and was etched, evenly, at a temperature of 95° to 100°F and at a spray pressure of about 10 PSI. Fresh ammonium persulfate solution, at 2.1 m/l and concentrated ammonia solution, at 15 m/l were added manually to the solution every 15 minutes to compensate for consumption due to the etching reaction.

Excess spent etchant was taken out from the etcher sump every 15 minutes to maintain a constant etchant solution volume of about 3 liters. The methanol concentration was maintained at about 1.0 percent by periodic replenishment. Etching tests and chemical analyses were performed every 30 minutes; results are summarized in Table II. Test circuit panels with 1-ounce copper and resisted with gold/nickel was used for the etching tests. Etch rates were determined during etching; etch factors (degree of undercutting during etching) were evaluated after etching. Methods for ammonium peroxydisulfate and dissolved copper analyses are shown under the caption "analytical procedures" following examples. Etchant pH was measured with a standard pH-meter using glass and reference electrodes; the etching temperature was maintained with a heater and was noted with a regular glass thermometer.

Table II

| Run No. | Ammonium Peroxydisulfate (m/l) | Chemical Analysis Dissolved copper (m/l) | pH | Etching Temp. (°F) | Etch Rate (mil/min) | Etch Factor |
|---|---|---|---|---|---|---|
| 1 | 0.32 | 0.65 | 9.60 | 95 | 1.01 | 2.0 |
| 2 | 0.31 | 0.68 | 9.57 | 99 | 1.04 | 2.0 |
| 3 | 0.28 | 0.71 | 9.61 | 98 | 0.98 | 1.7 |
| 4 | 0.19 | 0.72 | 9.60 | 98 | 0.94 | 1.8 |
| 5 | 0.21 | 0.74 | 9.64 | 98 | 0.91 | 1.7 |
| 6 | 0.22 | 0.71 | 9.64 | 99 | 0.91 | 1.6 |

The two and a half hour continuous etching trail (Table II) showed the etching process was capable of producing high and constant etch rates of 0.9 to 1.0 mil/min and high etch factors of 1.6 to 2.0 for the Au/Ni resisted test panels; the higher the etch factor the least the undercutting during etching. Definition of etch factor has been given with Example 1.

The apparent peroxydisulfate utilization of this continuous run was calculated to be 64.8 percent. The calculation was made from the total weight of copper used and the total weight of peroxydisulfate consumed due to etching, decomposition and loss in the outgoing spent etchant solution.

EXAMPLE 6

This example illustrates the continuous automatic etching process of the invention as shown in the flow diagram of the drawing.

A solution was made to contain about 0.003 m/l of ammonium peroxydisulfate, about 1 m/l of copper amine sulfate, about 1 m/l of ammonium sulfate, about 1.5 m/l of free ammonia to give an etchant pH of about 9.6, and about 1% methanol. About 2.8 liters of this solution was transferred to the sump of a spray etcher equipped with a heater and a cooling coil for maintaining the etchant at a constant temperature of 120°F.

A platinum electrode and a reference electrode (silver-silver chloride) were immersed into the etchant solution. The potential developed was read with the EMF meter. When the EMF fell below 300 mv indicating that the peroxydisulfate concentration was below about 0.003 m/l, the output from the EMF meter triggered a voltage sensitive relay which turned on a pump; the pump delivered a peroxydisulfate feed solution, about 1.3 m/l at a flow rate of 13.6 mil/min to the etcher. The peroxydisulfate feed stopped when the EMF reached 410 mv indicating that a peroxydisulfate concentration of about 0.02 m/l or more in the etchant solution had been reached. The EMF may continue to increase due to the slow formation of the active species.

A glass-reference combination electrode was immersed into the etchant solution; potential developed from the electrode was sent to a pH-meter which indicated the pH of the etchant solution. When the pH of the solution fell below 9.5, the output of the pH-meter triggered a voltage sensitive relay which turned on a solenoid valve and ammonia gas from a cylinder, at 15–20 PSI, was allowed to flow into the etcher through a sparger immersed in the etchant solution. The flow of ammonia gas stopped when the etchant reached a pH of 9.7.

Excess spent etchant was pumped out from the etcher automatically with a pump; methanol was kept at about 1 percent by manual replenishment every half hour.

Metallic copper foil was fed into the etcher constantly at a rate of about 1.1 g/min; the etchant solution was allowed to spray etch the copper at a spray pressure of about 20 PSI.

Periodic etching tests were performed during the total of 2 hours and 10 minutes of continuous etching. The tests showed that the system produced high and fairly constant etch rates of 1.1 to 1.2 mil/min and high etch factors of about 1.8 to 2.1 for gold-nickel-resisted circuit test panels. The EMF and pH readings showed that during the run the peroxydisulfate and the free ammonia concentrations were controlled at the desired levels. Results are illustrated in Table III.

Table III

| Time after start | Etch Rates mil/min | Etch Factors* | EMF, mv | ph |
|---|---|---|---|---|
| 10 min | 1.09 | 1.76 | 400 | 9.63 |
| 70 min | 1.23 | 2.08 | 460 | 9.63 |
| 100 min | 1.23 | 2.00 | 440 | 9.67 |
| 130 min | 1.08 | 2.11 | 430 | 9.63 |

*Etch factors shown are for gold-nickel-resisted circuit test panels.

Etching tests were also performed with circuit test panels resisted with organic film, solder, bright solder and bright tin resists. The same high etch rates of about 1.1 mil/min and about the same etch factors were observed as for the Au/Ni resisted boards. The appearance of the etched test panels, particularly those resisted with solder and the bright tin, were excellent; the solder resisted retained its light gray color, and the bright solder and the bright tin resists retained their original brightness. All etched test panels were cleanly etched and unmottled.

At the end of the continuous etching run, the peroxydisulfate utilization was calculated from the weight of all the copper foil used and the total peroxydisulfate solution consumed. A very high peroxydisulfate utilization of 99 percent was obtained. During the entire etching run, the etchant solution was found to be stable; no signs of excessive peroxydisulfate decomposition or run-away reaction were observed.

EXAMPLE 7

Another continuous etching trial, with automatic control and instrumentation, was carried out similar to that shown in Example 6, except at this time no stabilizer was used and the EMF was controlled at 400–500 mv range.

During the total of 2 hours of continuous etching, periodic etching tests were preformed which showed the system produced fairly constant etch rates of about 1.1 mil/min for gold-nickel-resisted test panels. The etch factors for gold-nickel-resisted test panels were about the same as those listed in Example 6. Results of the etching tests as well as the EMF and pH readings are shown in Table IV.

Table IV

| Time after start | Etch Rates mil/min | Etch Factors* | EMF, mv | pH |
|---|---|---|---|---|
| 40 min | 1.09 | 1.82 | — | — |
| 80 min | 1.08 | 1.65 | 450 | 9.58 |
| 120 min | 1.05 | 1.09 | 440 | 9.62 |

*Etch factors shown are for gold-nickel-resisted test panels.

Again, the etchant solution was found to be stable and no signs of excessive peroxydisulfate decomposition or run-away reaction were observed. The etching system behaved perfectly. The peroxydisulfate utilization was calculated to be greater than 90 percent.

EXAMPLE 8

Another continuous etching trial was carried out similar to that shown in Example 7, except at this time no automatic peroxydisulfate concentration control was used. The peroxydisulfate, at 1.6 m/l, was fed into the etcher at a constant flow rate of 12 ml/min and metallic copper foil was fed at a rate of 0.8 g/min. No stabilizer was used in this run.

During the total of three and a half hours of continuous etching, periodic etching tests were performed; results are summarized in Table V.

Table V

| Time after start | Etch Rates, mil/min | Etch Factors* | pH |
|---|---|---|---|
| 50 min | 0.99 | 1.19 | 9.5–9.6 |
| 100 min | 1.05 | 1.41 | 9.5–9.6 |
| 150 min | 0.92 | 1.30 | 9.5–9.6 |
| 210 min | 0.89 | 1.37 | 9.5–9.6 |

*Etch factors are for gold-nickel-resisted test panels.

Table V shows that the etch rates and etch factors produced from this run are slightly lower than those shown in Example 8. The etchant solution was found to be stable but a low peroxydisulfate utilization of 76.8 percent was observed.

EXAMPLE 9

The procedure of Example 3 was followed except that sodium peroxydisulfate was used in place of ammonium peroxydisulfate.

A solution was prepared to contain about 0.25 m/l of sodium peroxydisulfate, about 0.8 m/l of copper sulfate, about 0.8 m/l of sodium sulfate and 1 percent methanol. About 2.1 m/l of total ammonia was present to produce an etchant pH of 10.4. This solution was warmed to 100°F and was allowed to spray onto copper laminate test panels at a spray pressure of 20 PSI in an etching chamber. An etch rate of 0.35 mil/min was observed. Ammonia gas was introduced to the etchant solution to increase its pH from 10.4 to 10.8, an etch rate of 0.70 mil/min was observed. The etchant pH was increased further to 11.0, a high etch rate of 0.98 mil/min was noted.

EXAMPLE 10

A continuous etching trial, with automatic control and instrumentation was carried out exactly similar to Example 6, except this time the stabilizer was nitrilotriacetic acid (NTA). The copper amine sulfate concentration was 1.2 m/l, the ammonium sulfate concentration was 0.94 m/l and the NTA concentration was 1.2 g/l. The EMF was controlled at 450 mv, the pH at 9.5 and the temperature was 120°F. The feed solution was 300 g/l ammonium persulfate and 1.2 g/l NTA. Etch rate during a 2 hour run ranged from 1.47 to 1.62 mils/-min and the overall peroxydisulfate efficiency was 127 percent.

EXAMPLE 11

A continuous etching trial, with automatic control and instrumentation was carried out exactly similar to Example 10, except this time the stabilizer was iminodiacetic acid at a concentration of 1.2 g/l. The average etch rate throughout a 1½ hour run was 1.41 mil/min and the peroxydisulfate efficiency was 121 percent.

EXAMPLE 12

A continuous etching trial, with automatic control and instrumentation was carried out exactly similar to Example 10 except this time the stabilizer was sarcosine at a concentration in the etchant and persulfate feed solution of 1.2 g/l. Average etch rate throughout a 4 hour etching trial was 1.3 mils/min and the peroxydisulfate efficiency was 144 percent.

Peroxydisulfate efficiencies over 100 percent are due to air oxidation.

ANALYTICAL PROCEDURES

I. Determination of Ammonium Peroxydisulfate in an Ammoniacal Peroxydisulfate Etchant

PROCEDURE

1. Pipet 5.0 ml of etchant into a 250 ml Erlenmeyer flask.
2. Acidify the etchant sample with 25 ml of 25 wt. percent $H_2SO_4$ solution, then dilute to 100 ml of DI water. The resulting solution would have the required acidity of about 1 N $H_2SO_4$.
3. Add precisely 20.0 ml of 0.4 N Fe (II) solution, stir the mixture 2–3 minutes.
4. Titrate the resulting solution with standardized $KMnO_4$ solution (about 0.5 N) to a slightly pink end-point. Note the $KMnO_4$ solution volume as Vs.
5. Titrate a blank by repeating the above steps without the etchant sample. Note the $KMnO_4$ solution volume as $V_B$.

Calculation

Ammonium Peroxydisulfate, m/l = ($V_B$–Vs) × N of $KMnO_4$ × 0.10.

II. Determination of Dissolved Copper in an Ammoniacal Peroxydisulfate Etchant with a Spectronic–20 Colorimeter (at 730 mμ).

Sample Preparation

1. Pipet 5.0 ml sample to a 100.0 ml volumetric flask.
2. Acidify the etchant sample with 10 ml 25 wt percent $H_2SO_4$ solution, then dilute to the mark with DI water.

Measurement

1. Warm up the Spectronic–20 by turning it on for at least 15 minutes.
2. Adjust the instrument to read 0 transmittance.
3. Fill a clean Spectronic–20 test tube with DI water, wipe dry any water outside the test tube, insert the test tube into the holder of the instrument, adjust the instrument to read 100 percent transmittance at 730 mμ.
4. Use the same test tube, rinse and fill with the prepared sample solution.
5. Insert to the holder of the instrument, read the absorbance at 730 mμ.

Calculation

Dissolve Copper, m/l = Absorbance × 1.89.

What is claimed is:

1. A continuous process of producing copper circuits which comprises providing (1) a resisted circuit pattern on a copper surface, (2) contacting the resulting workpiece with an etchant comprising an ammoniacal aqueous solution of from about 0.4 mole/liter to limit of solubility of cupric amine sulfate and containing sufficient ammonia and ammonium salt to provide a pH of 8 to 12, while maintaining the solution in an oxidizing condition by adding thereto sufficient soluble peroxydisulfate whereby its concentration in said solution is equivalent to from about 0.001 mole/liter to about 0.4 mole per liter and corresponding to an EMF potential developed between a platinum electrode and a silver-silver chloride reference electrode immersed in the etchant solution of about 200 to 540 millivolts at a temperature of about 90°F to 130°F and (3) removing the etched workpiece from the etching solution.

2. A method according to claim 1 wherein the peroxydisulfate is ammonium peroxydisulfate.

3. A method according to claim 1 wherein the etchant contains a stabilizing agent selected from the group consisting of mono- and polyorganoamines, carboxy-substituted mono- and polyorganoamines and metal salts thereof, hydroxy-substituted mono- and polyorganoamines, mono- and polyorganoaminoethers, urea and mono- and dialkyl substituted ureas, hydroxy carboxylic acids, monohydroxy alcohols, dihydroxy alcohols, monoacylated dihydroxy alcohols, keto alcohols and aliphatic ketones and ethers.

4. The method according to claim 3 wherein the etchant contains a stabilizer selected from the group acrylamine, methanol, sarcosine, iminodiacetic acid or nitrilotriacetic acid.

5. The method according to claim 2 wherein the concentration of the ammonium peroxydisulfate does not exceed about 0.1 mole/liter.

6. A method for the continuous and automatic production of copper circuits which comprises providing (1) a resisted circuit pattern on a copper surface; (2) contacting the resulting workpiece with an aqueous etchant comprising (a) from about 0.4 moles/liter to the limit of solubility of cupric amine sulfate, (b) sufficient ammonia and an ammonium salt to buffer the ammonia in order to maintain the pH from about 9–10, and (c) up to about 0.1 mole/liter of a soluble peroxydisulfate whereby the etchant is maintained in an oxidizing condition; (3) controlling the pH of the etchant by feeding the signal from a pair of electrodes immersed in the etchant solution to a pH meter, the output of which is connected to a voltage sensitive relay which turns on a pump or a valve when the pH falls below a predetermined set point within the pH range thereby introducing ammonia into the etchant until the pH exceeds the predetermined set point at which point the relay turns off the pump or valve; (4) controlling the peroxydisulfate concentration by feeding the EMF signal developed between a platinum and a reference electrode in the etchant solution to a voltage sensitive relay which turns on a pump or valve when the EMF falls below a predetermined set point within the range of 0–500 millivolts thereby introducing persulfate solution into the etchant until the EMF exceeds the predetermined set point at which time the relay turns off the pump or valve thereby maintaining the etchant in an oxidizing condition and the level of persulfate not exceeding about 0.1 moles per liter; (5) retaining the workpiece in the etchant until the copper surface has been etched out; and (6) removing the etched workpiece from the etching solution.

7. The process according to claim 6 wherein the persulfate is ammonium persulfate.

8. The process according to claim 6 wherein the etchant contains a stabilizing agent selected from the group consisting of mono- and polyorganoamines, carboxy-substituted mono- and polyorganoamines and metal salts thereof, hydroxy-substituted mono- and polyorganoamines, mono- and polyorganoaminoethers, urea and mono- and dialkyl substituted ureas, hydroxy carboxylic acids, monohydroxy alcohols, dihydroxy alcohols, monoacylated dihydroxy alcohols, keto alcohols and aliphatic ketones and ethers.

9. The process according to claim 8 wherein the etchant contains a stabilizing agent selected from the group acrylamine, methanol, sarcosine, iminodiacetic acid or nitrilotriacetic acid.

* * * * *

UNITED STATES PATENT OFFICE

CERTIFICATE OF CORRECTION

Patent No. 3,837,945 Dated September 24, 1974

Inventor(s) John Shu-chi Chiang

It is certified that error appears in the above-identified patent and that said Letters Patent are hereby corrected as shown below:

Column 1, line 8, "of" first occurrence should read -- or --.

Column 2, line 53, "aqueous feed" should read --aqueous persulfate feed--.

Column 4, line 1, "use" should read --rise--. [Our error]

Column 6, line 61, "a 9.8" should read --a pH of 9.8--.

Column 9, line 1, "trail" should read --trial--.

Column 10, line 41, "preformed" is incorrect, should read --performed--. [Our error]

Column 11, line 41, "out exactly similar" should read --out similar--.

Signed and Sealed this

*ninth* Day of *September 1975*

[SEAL]

*Attest:*

RUTH C. MASON
*Attesting Officer*

C. MARSHALL DANN
*Commissioner of Patents and Trademarks*